United States Patent [19]
O'Grady et al.

[11] Patent Number: 6,110,623
[45] Date of Patent: Aug. 29, 2000

[54] SURFACE COATING METHOD TO HIGHLIGHT TRANSPARENT MASK DEFECTS

[75] Inventors: David S. O'Grady, Jericho; Denis M. Rigaill, South Burlington, both of Vt.

[73] Assignee: International Business Machines Corporation, Armonk, N.Y.

[21] Appl. No.: 09/224,697

[22] Filed: Jan. 4, 1999

[51] Int. Cl.[7] .................................................. G03F 9/00
[52] U.S. Cl. ........................................................... 430/5
[58] Field of Search ................................. 430/5, 322, 30, 430/313, 327, 329; 356/390, 237, 239

[56] References Cited

U.S. PATENT DOCUMENTS

| | | | |
|---|---|---|---|
| 4,725,139 | 2/1988 | Hack et al. | 356/237 |
| 5,563,702 | 10/1996 | Emery et al. | 356/73 |
| 5,650,854 | 7/1997 | Sugawara | 356/394 |
| 5,795,685 | 8/1998 | Liebmann et al. | 430/5 |

FOREIGN PATENT DOCUMENTS 6-282064  10/1994  Japan .

*Primary Examiner*—S. Rosasco
*Attorney, Agent, or Firm*—Ratner & Prestia; Howard J. Walter, Jr.

[57] ABSTRACT

A method for detection of a photomask defect. The method comprises the steps of applying a contrast-enhancing coating on the photomask and optically inspecting the photomask for defects. The contrast-enhancing coating may be copper, aluminum, molybdenum silicide, or any material capable of altering the reflectivity or transmissivity of defects.

18 Claims, 2 Drawing Sheets

SURFACE COATING METHOD TO HIGHLIGHT TRANSPARENT MASK DEFECTS

TECHNICAL FIELD

The present invention relates generally to transparent masks used in photolithography for the manufacture of integrated circuits and, more specifically, to the detection of defects in such transparent masks.

BACKGROUND OF THE INVENTION

Integrated circuits are manufactured using photolithographic processes that direct light through a transparent photomask, also known as a reticle, to project a circuit image onto a silicon wafer. The quality of the integrated circuits thus produced may be adversely affected by any defects present in the mask. Because defects are not uncommon in the masks, these defects must be detected and repaired before using the mask in a production process.

Typically, automated mask inspection systems, such as those manufactured by KLA Instruments Corporation of San Jose, California, are used to detect defects. Such automated systems direct an illumination beam at the photomask and detect the intensity of the portion of the light beam transmitted through and reflected back from the photomask. The detected light intensity is then compared with expected light intensity, and any deviation is noted as a defect. The details of one such automated mask inspection system, as well as a review of others, can be found in U.S. Pat. No. 5,563,702 assigned to KLA Instruments Corporation.

Referring now to the drawing, wherein like reference numerals refer to like elements throughout, FIGS. 1 and 2 show cross-sectional illustrations of a type of phase-shifting photomask 10 undergoing an inspection for defects.

A phase-shifting photomask typically comprises a top surface 11, a bottom surface 13, opaque regions 12, and transmissive regions 14. Opaque regions 12 typically comprise an opaque coating 16, such as chrome, over top surface 11 of mask 10. Transmissive regions 14 may contain patterns of recessed features 18 in top surface 11 that, by changing the thickness of the mask 10 through which the light travels from bottom surface 13 to top surface 11, shift the phase of the transmitted light. Such recessed features 18 may vary in depth depending on the phase change desired, with a feature that produces a phase change of 180° being twice the depth of a feature that produces a phase change of 90°, and so on. Non-etched areas 20 that are the full thickness of the mask 10 create no phase shift (0°). Between each area of different mask thickness there is an edge 22.

Using a completed photomask 10, a light source is transmitted through the photomask 10 from the bottom surface 13, through reducing lenses (not shown), and onto a silicon wafer (not shown). It is desired to transfer an integrated circuit pattern onto the silicon wafer. A photosensitive layer applied to the wafer (not shown) reacts to the different phases of light projected onto it through the photomask 10, and thus creates the exposed pattern on the wafer corresponding to the features in the photomask 10.

To test the photomask 10, one type of automated tool may direct light 30 into mask 10 through bottom surface 13, as shown in FIG. 1, and record with a detector (not shown) the intensity of the transmitted light 31 exiting top surface 11. Similarly, another type of tool may reflect light 32 off the mask top surface 11, as shown in FIG. 2, and detect the intensity of reflected light 33 with a detector (not shown) on the same side of the mask 10 as the light source. Other tools may use a combination of reflected and transmitted light, and may shine light from one side of the mask 10 and detect both light transmitted to the other side and light reflected back from the same side of the mask 10.

Typically, a transmissive inspection tool directs an illumination beam of light 30 through a path from the bottom surface 13 to the top surface 11 of photomask 10. The tool detects the transmitted light 31 of the illumination beam of light 30 that is transmitted through photomask 10, and generates a signal 40 representative of the detected transmitted portion of light 30. The tool also has an expected transmission signal (not shown) corresponding to the transmitted portion expected to be detected and compares signal 40 to this expected transmission signal. Discrepancies greater than a specified threshold are recorded.

Typical reflective inspection tools work much the same as transmissive inspection tools, except that they detect reflected light 33 of an illumination beam of light 32 directed onto the top surface 11 of the photomask 10. A signal 42 representative of the detected reflected portion is compared to a stored expected reflection signal (not shown), and discrepancies greater than a specified threshold are recorded.

Tools using a simultaneous reflective and transmissive inspection technique may direct an illumination beam of light 30 through a path to the top surface 11 of the photomask 10 (as shown in FIG. 1), detect the transmitted light 31, and generate a signal 40 representative of the detected transmitted portion. In addition, however, such tools also detect a portion of illumination beam of light 30 reflected back from the top surface 11 of the photomask and the pattern of recessed features 18 on the photomask 10. A signal (not shown, but similar to signal 42) is generated representative of the reflected light 35 detected. Then, the signals representative of the reflective and transmissive portions of light 30 are compared to one another to create a comparison value (not shown). The comparison value is compared to a stored, expected comparison value (not shown), and a report (not shown) is generated when the comparison value does not correspond to the stored expected comparison value.

By the various inspection techniques, signals (such as 40 and 42) generated by the detection of the reflected or transmitted illumination beam may include disruptions (such as 44 and 44') corresponding to edges 22 and to certain defects 50. By comparing the generated signal 40 or 42 to the expected reflection or transmission signal, the inspection tool can distinguish expected, intentional disruptions, such as those caused by edge 22, from defect-caused disruptions, such as those caused by the edges of defect 50.

As the size of integrated circuitry continues to shrink to meet the industry demand for more performance from smaller devices, the wavelengths used by such automated inspection systems may be too large for the resolution needed. Thus, for instance, 248 nm phase-shifting photomasks may have defects not detectable by the currently available 488 nm and 365 nm inspection systems. The inspection tools are generally tailored for use with a specific, fixed wavelength, corresponding to the wavelength of the laser incorporated in the tool. Even as such inspection tools may be updated with shorter wavelength lasers, however, the ever-changing nature of the integrated circuit industry will likely continue to create at least short-term disconnects between available inspection devices and actual manufacturing needs.

Thus, as depicted in FIGS. 1 and 2, the signal disruptions 44 and 44' corresponding to defect 50 or to edge 22 may be relatively small with respect to the instrument sensitivity. To enhance the performance of such optically based inspection tools, typically an operator may adjust to concentrate on a smaller pixel size. Typical automatic inspection tools use a mathematical algorithm to analyze the light intensity data, so concentration on a smaller pixel size essentially enhances the ability of the algorithm to detect smaller defects by applying the algorithm over a smaller area. Even so, however, the sensitivity to defects depends on how much the defect alters the transmissivity or reflectivity of the photomask substrate material, and some defects may not cause enough of an alteration to be detectable at all.

Therefore, it is an object of the present invention to provide an improved method for detecting defects in photomasks that overcomes the limitations discussed above. Another object is to enable inspection devices to meet existing and anticipated actual manufacturing needs. A more specific object of the present invention is to alter the transmissivity or reflectance of defects existing in a photomask so that the corresponding disruption in light intensity detected by an instrument will be more significant.

SUMMARY OF THE INVENTION

To achieve these and other objects, and in view of its purposes, the present invention provides a method for detection of a photomask defect, the method comprising the steps of:

a) applying a contrast-enhancing coating on the photomask; and b) optically inspecting the photomask for defects.

The method may be used in a process of manufacturing photomasks whereby a mask blank is first processed to form a desired number of image segments. The above method is then completed on the mask substrate, and the mask substrate is accepted or rejected on the basis of any defects detected.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
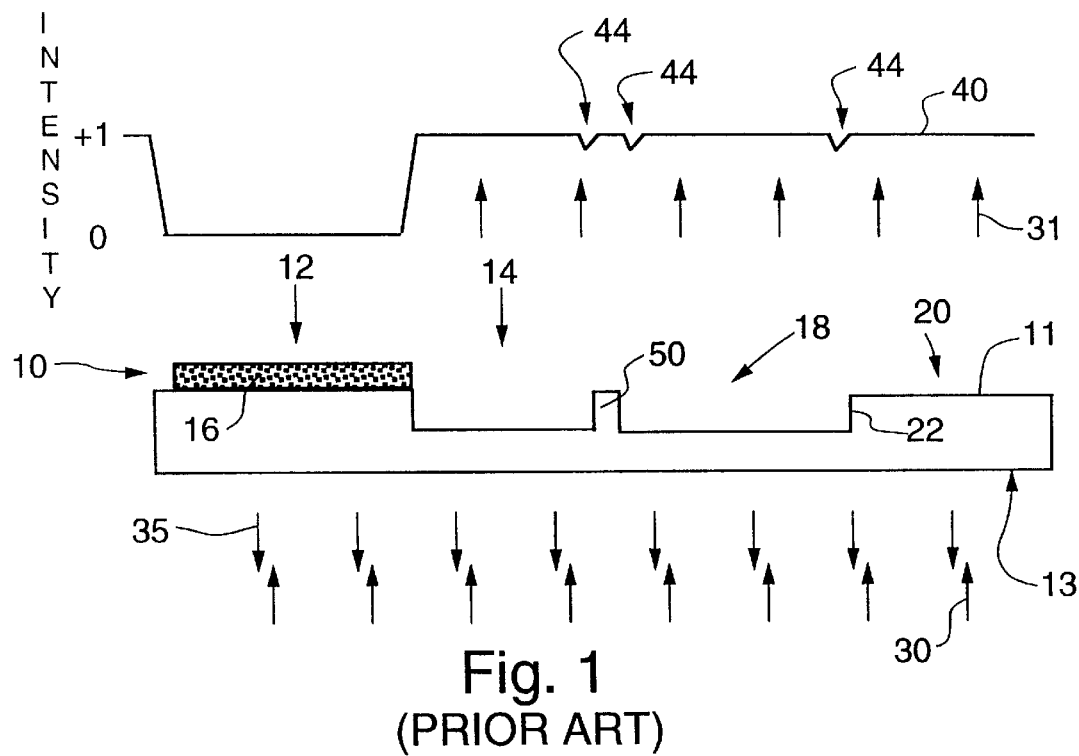
FIG. 1 is a cross-sectional view illustrating a photomask undergoing a transmitted light inspection and a depiction of exemplary corresponding light intensity signals.
Figure 2:
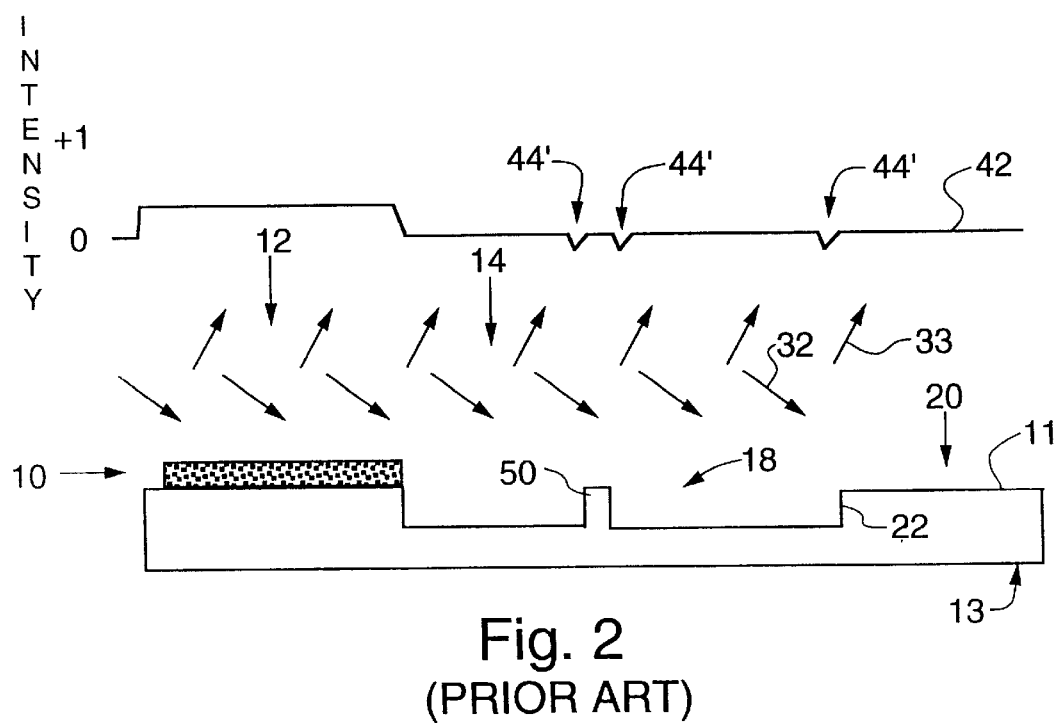
FIG. 2 is a cross-sectional view illustrating the photomask of FIG. 1 undergoing a reflected light inspection and a depiction of exemplary corresponding light intensity signals.
Figure 3:
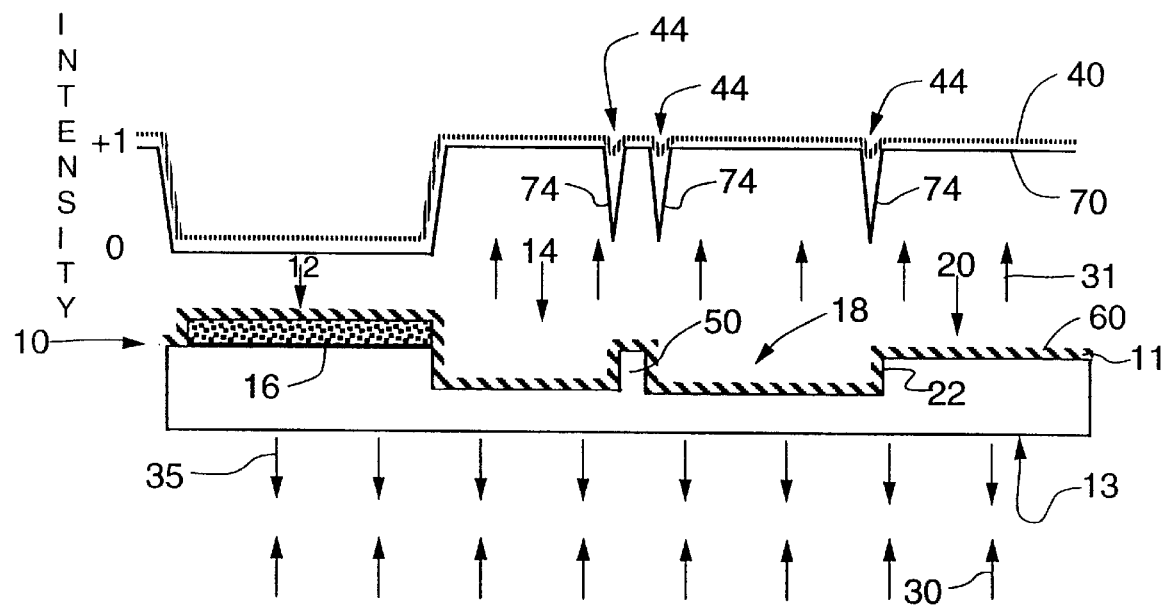
FIG. 3 is a cross-sectional view illustrating the photomask of FIG. 1 undergoing a transmitted light inspection in accordance with the present invention, and a depiction of exemplary corresponding light intensity signals both with and without the benefit of the present invention, for comparison.
Figure 4:
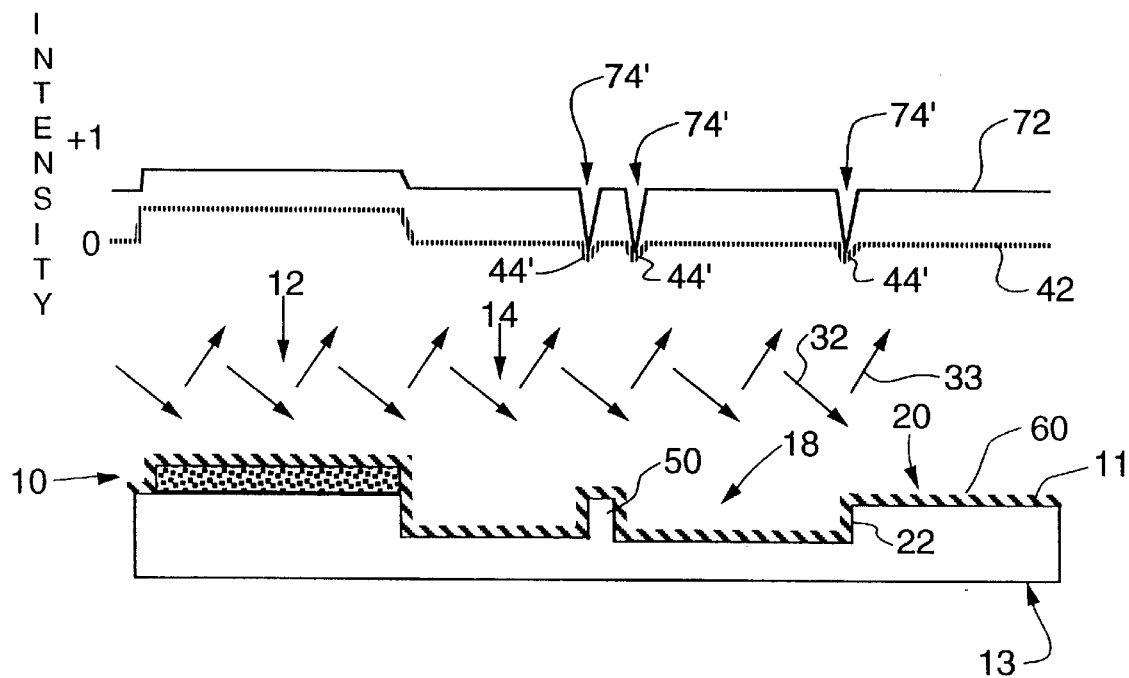
FIG. 4 is a cross-sectional view illustrating the photomask of FIG. 1 undergoing a reflected light inspection in accordance with the present invention, and a depiction of exemplary corresponding light intensity signals both with and without the benefit of the present invention, for comparison.

Referring again to the drawing, FIGS. 3 and 4 show cross-sectional views illustrating a typical phase-shifting photomask 10 undergoing an inspection for defects in accordance with the present invention. As shown in both FIGS. 3 and 4, top surface 11 of photomask 10 has been coated with a thin, contrast-enhancing layer 60. The effect of contrast-enhancing layer 60 is to alter the transmissivity or reflectance of defects such as defect 50 so that the corresponding disruption in light intensity detected by the instrument will be more significant.

Thus, for instance, in FIG. 3, light intensity signal 70 depicts substantial disruptions 74 corresponding to defect 50 and edge 22, relative to the minimal disruptions 44 in intensity signal 40 produced by the prior art, as shown for comparison. Similarly, in FIG. 4, light intensity signal 72 shows substantial disruptions 74' relative to minimal disruptions 44' in intensity signal 42 of the prior art.

Contrast-enhancing layer 60 may be any material that alters the transmissivity or reflectivity of a defect. In particular, a layer of copper, aluminum, or molybdenum silicide, preferably 50 to 150 Angstroms thick, is desirable. In a preferred embodiment, where the photomask 10 is designed for use with a 248 nm illumination source, a layer of copper 50 Angstroms thick is deposited by chemical vapor deposition (CVD). The copper is deposited using a CVD application tool typically used for application of a thin copper coating to photomasks before scanning electron microscope (SEM) analysis or before repairing photomask defects. The contrast-enhancing layer 60 may also be deposited by sputtering or any method known in the art. Regardless of the application technique, it is important to maintain the contrast-enhancing layer 60 free of contaminants.

Contrast-enhancing layer 60 may make defects darker (and thus less transmissive), it may make them more reflective, and, for otherwise clear defects, it may merely enhance the contrast of the defects so that the inspection tool may more easily find them. Different contrast-enhancing layers 60 and thicknesses may be chosen based on the type of inspection tool, the type of defect desired for detection, and the type of coating layers readily available via existing production tools. Generally, however, the shorter the wavelength of the projection system, the thinner the contrast-enhancing layer 60 required.

In a typical photomask manufacturing process, a photomask blank may be processed via any method known in the art to form a desired number of image segments or recessed features 18, as shown on photomask 10 in FIGS. 3 and 4. Next, a contrast-enhancing layer 60 of suitable material is applied to the mask blank, and the mask substrate is optically inspected for defects by any method known in the art. In particular, the optical inspection techniques may be any of those described below. Finally, the mask substrate may be accepted or rejected on the basis of any defects detected by the optical inspection. Although the mask substrate may be inspected at any intermediate time in the processing cycle before all of the features are incorporated into the mask, the method of the present invention is preferably performed on an otherwise completed mask.

The method of optical inspection may comprise a transmissive inspection, a reflective inspection, or a combination method that uses both reflective and transmissive inspection. A transmissive inspection method, as illustrated in FIG. 3, generally comprises directing an illumination beam of light 30 through a path from bottom surface 13 to top surface 11 of photomask 10, detecting transmitted light 31 of the illumination beam transmitted though the photomask 10, and generating a first signal representative of the transmitted portion detected. The method further comprises storing an expected comparison signal corresponding to a transmitted portion expected to be detected, and comparing the first signal to the expected comparison signal. Any discrepancy between compared signals that is greater than a specific threshold is recorded.

A reflective inspection method, as illustrated in FIG. 4, may generally comprise directing an illumination beam of light 32 onto top surface 11 of photomask 10, detecting reflected light 33 of the illumination beam reflected from the top surface 11, and generating a first signal representative of the reflected portion detected. The method also comprises generating an expected comparison signal corresponding to a reflected portion expected to be detected, and comparing the first signal to the expected comparison signal. Again, any discrepancy between compared signals that is greater than a specific threshold is recorded.

A combination reflective and transmissive method, as illustrated in FIG. 3, comprises directing an illumination beam of light 30 through a path from bottom surface 13 to top surface 11 of photomask 10, detecting transmitted light 31 of the illumination beam transmitted though the photomask 10, and generating a first signal representative of the transmitted portion detected, just as in the transmissive method. The combination method further comprises, however, also detecting reflected light 35 of the illumination beam reflected back from the photomask 10 and generating a second signal representative of the reflected portion detected. Next, a comparison value of the first and second signals with respect to each other is created. Expected comparison values are stored, and the actual and expected values are compared. The method then comprises generating a report when the actual comparison value does not correspond to the stored expected comparison value.

After contrast-enhancing layer 60 has been used during the inspection procedure, it can then be removed from photomask 10 by any method known in the art. A wet chemical stripping step is preferred. After the contrast-enhancing layer 60 is removed, the photomask 10 is then ready for further processing or use in the projection of circuit patterns onto wafers.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method for detection of a defect in a photomask, the method comprising the steps of:
    (a) applying a contrast-enhancing coating on the photomask; and
    (b) optically inspecting the photomask for defects.

2. The method of claim 1, wherein said photomask has a patterned top surface and a bottom surface, and step (b) comprises the steps of:
    (i) directing an illumination beam through a path from the bottom surface to the top surface of said photomask;
    (ii) detecting a transmitted portion of said illumination beam transmitted though said photomask;
    (iii) generating a first signal representative of said transmitted portion detected;
    (iv) generating an expected comparison signal corresponding to a transmitted portion expected to be detected;
    (v) comparing the first signal to the expected comparison signal and recording any discrepancy greater than a specific threshold.

3. The method of claim 2 in which the photomask is a phase-shifting photomask.

4. The method of claim 1, wherein said photomask has a patterned top surface and a bottom surface, and step (b) comprises the steps of:
    (i) directing an illumination beam onto the top surface of said photomask;
    (ii) detecting a reflected portion of said illumination beam reflected from said top surface;
    (iii) generating a first signal representative of said reflected portion detected;
    (iv) generating an expected comparison signal corresponding to a reflected portion expected to be detected; and
    (v) comparing the first signal to the expected comparison signal and recording any discrepancy greater than a specific threshold.

5. The method of claim 4 in which the photomask is a phase-shifting photomask.

6. The method of claim 1, wherein said photomask has a patterned top surface and a bottom surface, and step (b) comprises the steps of:
    (i) directing an illumination beam through a path from the bottom surface to the top surface of said photomask and said pattern thereon;
    (ii) detecting a transmitted portion of said illumination beam transmitted though said photomask;
    (iii) generating a first signal representative of said transmitted portion detected;
    (iv) detecting a reflected portion of said illumination beam reflected back from said photomask;
    (v) generating a second signal representative of said reflected portion detected;
    (vi) generating a comparison value of said first and second signals with respect to each other;
    (vii) storing an expected comparison value; and
    (viii) generating a report when the comparison value of step (vi) does not correspond to the expected comparison value stored in step (vii).

7. The method of claim 6 in which the photomask is a phase-shifting photomask.

8. The method of claim 1, wherein the layer of contrast-enhancing material is deposited by chemical vapor deposition.

9. The method of claim 1, wherein the layer of contrast-enhancing material is deposited by sputtering.

10. The method of claim 1, wherein the layer of contrast-enhancing material alters at least one of the transmissivity and the reflectivity of the defect.

11. The method of claim 1, wherein the layer of contrast-enhancing material is selected from a group consisting of copper, aluminum, and molybdenum silicide.

12. The method of claim 11, wherein the layer of contrast-enhancing material has a thickness in the range of 50 to 150 Angstroms.

13. The method of claim 12, wherein the photomask is designed to be used with an illumination source of 248 nm and the layer of contrast-enhancing material is copper having a thickness of about 50 Angstroms.

14. The method of claim 13 in which the photomask is a phase-shifting photomask.

15. The method of claim 12 in which the photomask is a phase-shifting photomask.

16. The method of claim 1 in which the photomask is a phase-shifting photomask.

17. A process for manufacturing a semiconductor mask, the process comprising:
(a) processing a mask substrate to form a desired number of image segments;
(b) applying a layer of contrast-enhancing material on the mask substrate;
(c) optically inspecting the mask substrate for defects; and
(d) accepting or rejecting said mask substrate on the basis of any defects detected in step (c).

18. The process of claim 17 in which the photomask is a phase-shifting photomask.

* * * * *